United States Patent
Jou et al.

(10) Patent No.: US 8,900,421 B2
(45) Date of Patent: Dec. 2, 2014

(54) METHOD OF FABRICATING RESISTANCE MEMORY

(75) Inventors: Shyan-kay Jou, Taipei County (TW); Chia-Jen Li, Taipei County (TW)

(73) Assignee: National Taiwan University of Science and Technology, Taipei (TW)

( * ) Notice: Subject to any disclaimer, the term of this patent is extended or adjusted under 35 U.S.C. 154(b) by 1000 days.

(21) Appl. No.: 12/699,895

(22) Filed: Feb. 4, 2010

(65) Prior Publication Data

US 2011/0132745 A1 Jun. 9, 2011

(30) Foreign Application Priority Data

Dec. 9, 2009 (TW) .............................. 98142142 A

(51) Int. Cl.
C23C 14/34 (2006.01)

(52) U.S. Cl.
USPC ............ 204/192.15; 204/192.22; 204/192.23; 204/192.25

(58) Field of Classification Search
USPC .............. 204/192.15, 192.22, 192.23, 192.25
See application file for complete search history.

(56) References Cited

U.S. PATENT DOCUMENTS

| 4,591,417 | A | * | 5/1986 | Kaiser et al. | ............. | 204/192.23 |
| 4,973,525 | A | * | 11/1990 | Chien et al. | ................. | 428/846.2 |
| 2003/0053789 | A1 | * | 3/2003 | Marsh et al. | ................... | 385/141 |
| 2004/0264234 | A1 | * | 12/2004 | Moore et al. | ................... | 365/148 |

FOREIGN PATENT DOCUMENTS

TW I254447 5/2006

OTHER PUBLICATIONS

Article Titled "Nonpolar Nonvolatile Resistive Switching in Cu doped ZrO2", jointly authored by Guan et al., in IEEE, Electron Device Letters, vol. 29, No. 5, May 2008. pp. 434-437.
Article Titled "A Low-Power Nonvolatile Switching Element Based on Copper—Tungsten Oxide Solid Electrolyte", jointly authored by Kozicki, in IEEE Transactions on Nanotechnology, vol. 5, No. 5, Sep. 2006. pp. 535-544.
Article Titled "On the resistive switching mechanisms of Cu/ZrO2: Cu/Pt" jointly authored by Guan et al, in Applied Physics Letters 93, 223506 (2008) pp. 223506-1-223506-3.
Article Titled "Bipolar and Unipolar Resistive Switching in Cu-doped SiO2", jointly authored by Schindler et al., in IEEE Transactions on Electron Devices, vol. 54, No. 10, Oct. 2007. pp. 2762-2768.
Article Titled "Electrode kinetics of Cu—SiO2-based resistive switching cells: Overcoming the voltage-time dilemma of electrochemical metallization memories", jointly authored by Schindler et al., in Applied Physics Letters 94, 072109 (2009 ), pp. 072109-1-072109-3.

(Continued)

Primary Examiner — Jason M Berman
(74) Attorney, Agent, or Firm — Jianq Chyun IP Office

(57) ABSTRACT

A method of fabricating a variable resistance layer of a resistance memory is disclosed. The method includes placing a substrate in a sputtering chamber that has a copper target and a silicon oxide ($SiO_2$) target or has a complex target made from copper and silicon oxide therein. Thereafter, a co-sputtering process is performed by using the copper target and the silicon oxide target, or a sputtering process is performed by using the complex target, so that a compound film is deposited on a surface of the substrate, wherein the compound film serves as a variable resistance layer of a resistance memory, and the mole percentage of Cu/(Cu+Si) of the compound film is 1-15%.

16 Claims, 5 Drawing Sheets

(56) References Cited

OTHER PUBLICATIONS

Article Titled "Excellent uniformity and reproducible resistance switching characteristics of doped binary metal oxides for non-volatile resistance memory applications", jointly authored by Lee et al., in IEDM 2006, 346733.

Article Titled "Resistive switching in transition metal oxides", authored by A. Sawa, in Materials Today, vol. 11, No. 6, (Jun. 2008) pp. 28-36.

Article Titled "Write Current Reduction in Transition Metal Oxide Based Resistance-Change Memory", jointly authored by Ahn, et al., in Advanced Materials, 2008, 20, pp. 924-928.

* cited by examiner

METHOD OF FABRICATING RESISTANCE MEMORY

CROSS-REFERENCE TO RELATED APPLICATION

This application claims the priority benefit of Taiwan application serial no. 98142142, filed Dec. 9, 2009. The entirety of the above-mentioned patent application is hereby incorporated by reference herein and made a part of specification.

BACKGROUND OF THE INVENTION

1. Field of the Invention

The present invention generally relates to a method of fabricating a resistance memory, and more particularly, to a method of fabricating a variable resistance layer of a resistance memory.

2. Description of Related Art

The resistance memory is a memory based on the resistive state thereof for writing data. Since the resistance memory is advantageous in compatibility with the process for complementary metal oxide semiconductor transistor (CMOS transistor), simple structure, small size, fast operation speed and low electricity-consumption, it has become a popular non-volatile memory currently.

A resistance memory 100 is usually shown as FIG. 1, which includes an upper electrode 102, a lower electrode 104 and a variable resistance layer 106 located between the upper electrode 102 and the lower electrode 104, so that the resistance memory 100 has a sandwich structure of metal-insulation-metal (MIM). The resistance value (or resistive state) of the resistance memory 100 can be controlled to a high resistive state (HRS or termed as "insulation state") and a low resistive state (LRS or termed as "conductive state") by adjusting the voltage applying between the upper electrode 102 and the lower electrode 104. The appropriate material to make the variable resistance layer 106 includes, for example, organic macromolecule material, solid-state electrolyte, calcium-titanium mineral material or oxide at present.

If silicon oxide ($SiO_2$) is selected as the major component of a resistance layer, an additional metal component, for example, copper (Cu), is required to add in, so that the switch between HRS and LRS can be achieved. The method of adding copper into the $SiO_2$ layer currently is mostly to plate copper onto the $SiO_2$ layer, followed by annealing in high-temperature (higher than 500° C.) so as to allow copper to thermally diffuse into the $SiO_2$ layer as described in Schindler et al, IEEE Transactions on Electron Devices, Vol. 54, No. 10, pp. 2762-2768 (2007).

However, the above-mentioned method to fabricate a Cu—$SiO_2$ variable resistance layer requires at least two steps after forming the $SiO_2$ layer. In addition, the diffusion procedure needs a very high temperature, so that the above-mentioned method is not ideal in terms of the fabricating period and the cost (energy consumption).

SUMMARY OF THE INVENTION

Accordingly, the present invention is directed to a method of fabricating a variable resistance layer of a resistance memory, which can simply fabricate a variable resistance layer of a resistance memory.

The present invention provides a method of fabricating a variable resistance layer of a resistance memory. The method includes placing a substrate in a sputtering chamber having at least a copper target and a silicon oxide target, and then performing a co-sputtering process by using the copper target and the silicon oxide target, so that a compound film is deposited on a surface of the substrate, wherein the mole percentage of Cu/(Cu+Si) of the compound film is 1-15%.

In an embodiment of the present invention, the powers of a direct current voltage (DC voltage) or a radio frequency voltage (RF voltage) applied on the copper target and on the silicon oxide target are different from each other.

In an embodiment of the present invention, the thickness of the above-mentioned compound film ranges between 10 nm and 100 nm.

In an embodiment of the present invention, in the above-mentioned sputtering chamber, a substrate support is in the sputtering chamber for supporting the above-mentioned substrate. Besides, during the co-sputtering process, the substrate support may be rotated.

In an embodiment of the present invention, during the co-sputtering process, the substrate may be heated or not.

In an embodiment of the present invention, during the co-sputtering process, the temperature of the substrate ranges between 25° C. and 150° C.

In an embodiment of the present invention, the pressure of the above-mentioned co-sputtering process is, for example, between $5\times10^{-3}$ Torr and $5\times10^{-2}$ Torr.

In an embodiment of the present invention, the gas of the above-mentioned co-sputtering process includes 100 vol. % argon gas or argon gas containing larger than 0 to 20 vol. % oxygen gas.

The present invention also provides a method of fabricating a variable resistance layer of a resistance memory. In the method, a substrate is first placed in a sputtering chamber having at least a complex target made from copper (Cu) and silicon oxide ($SiO_2$), wherein the mole percentage of Cu/(Cu+Si) of the complex target is 1-15%. Afterward, a sputtering process is performed by using the above-mentioned complex target, so that a compound film is deposited on the surface of the substrate.

In an embodiment of the present invention, the thickness of the above-mentioned compound film ranges between 10 nm and 100 nm.

In an embodiment of the present invention, in the above-mentioned sputtering chamber, a substrate support is in the sputtering chamber for supporting the above-mentioned substrate.

In an embodiment of the present invention, during the sputtering process, the substrate is heated or not.

In an embodiment of the present invention, during the sputtering process, the temperature of the substrate ranges between 25° C. and 150° C.

In an embodiment of the present invention, the pressure of the above-mentioned sputtering process is, for example, between $5\times10^{-3}$ Torr and $5\times10^{-2}$ Torr.

In an embodiment of the present invention, the gas of the above-mentioned sputtering process includes 100 vol. % argon gas or argon gas containing larger than 0 to 20 vol. % oxygen gas.

Based on the mention above, the method of the present invention is able to simplify the procedure of fabricating a variable resistance layer of a resistance memory, wherein only one depositing step is required to form the compound film of Cu and $SiO_2$ and the high-temperature process in the prior art is omitted.

BRIEF DESCRIPTION OF THE DRAWINGS

The accompanying drawings are included to provide a further understanding of the invention, and are incorporated

DESCRIPTION OF THE EMBODIMENTS

Figure 1:
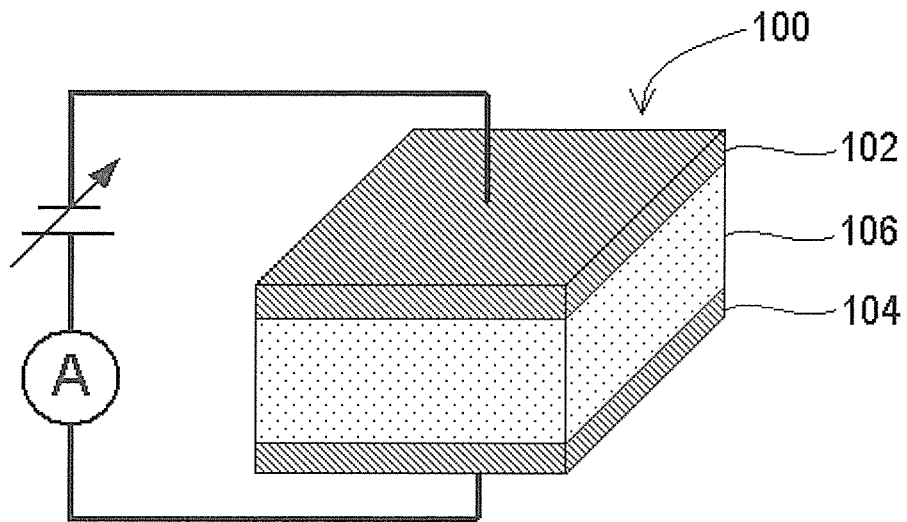
FIG. 1 is a diagram of a conventional resistance memory.

Reference will now be made in detail to the present preferred embodiments of the invention, examples of which are illustrated in the accompanying drawings. Wherever possible, the same reference numbers are used in the drawings and the description to refer to the same or like parts.

Figure 2:
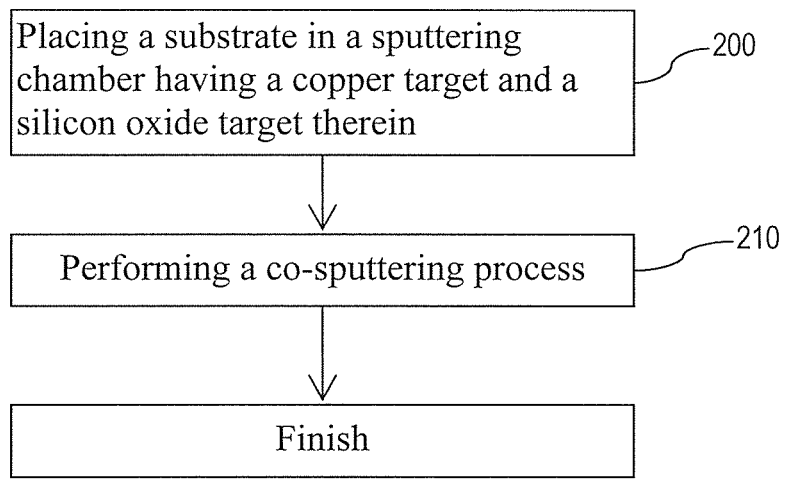
FIG. 2 is a schematic process flowchart of fabricating a variable resistance layer of a resistance memory according to an embodiment of the present invention.

FIG. 2 is a schematic process flowchart of fabricating a variable resistance layer of a resistance memory according to an embodiment of the present invention.

In step 200 of FIG. 2, a substrate is placed in a sputtering chamber which has at least a copper target and a silicon oxide target therein. Moreover, a substrate support is further in the sputtering chamber in order to support the above-mentioned substrate, for example.

In step 210, a co-sputtering process is then performed so as to deposit a compound film on a surface of the substrate. In the embodiment, the co-sputtering process is performed by using the above-mentioned Cu target and the $SiO_2$ target. The mole percentage of Cu/(Cu+Si) of the deposited compound film is 1-15%, and thus it is suitable to serve as the variable resistance layer of a resistance memory. The thickness of the above-mentioned compound film ranges between 10 nm and 100 nm, for example.

In the embodiment, the powers of the DC voltage or RF voltage applied on the copper target and on the silicon oxide target are different from each other. The pressure of the above-mentioned sputtering process is, for example, between $5 \times 10^{-3}$ Torr and $5 \times 10^{-2}$ Torr. The gas of the above-mentioned sputtering process, for example, includes 100 vol. % argon gas or argon gas containing larger than 0 to 20 vol. % oxygen gas.

During the above-mentioned co-sputtering process, the substrate support may be rotated so that a more uniform deposited compound film can be obtained. In addition, during the co-sputtering process, the substrate can be selectively heated or not. For example, the temperature of the substrate may be between 25° C. and 150° C.

In following, some of experiments are particularized to prove the efficiency of the above-mentioned embodiment. It should be noted that the present invention is not limited to the following experiments.

Experiment 1

First, a platinum film (Pt film) is formed on a substrate and the Pt film serves as the lower electrode of a resistance memory. After that, the above-mentioned substrate is placed on a substrate support in a sputtering chamber having a Cu target and a $SiO_2$ target.

Next, a co-sputtering process is performed, wherein the operation condition is specified as following: a pressure is $2 \times 10^{-2}$ Torr, a gas is pure argon gas, the substrate is not heated, and the rotation speed of the substrate support is 3 rpm. Under the above-mentioned condition, a $Cu-SiO_2$ film layer is deposited on the platinum film of the substrate, wherein the thickness of the above-mentioned deposited $Cu-SiO_2$ film layer is about 50 nm and the mole percentage of Cu/(Cu+Si) is about 9.8% which is suitable to serve as the variable resistance layer of a resistance memory.

Finally, a Cu film is formed on the $Cu-SiO_2$ layer and the Cu film serves as the upper electrode of the resistance memory.

Finally, a Cu film is fanned on the $Cu-SiO_2$ layer and the Cu film serves as the upper electrode of the resistance memory.

Experiment 2

Experiment 2 has the same condition as Experiment 1 except that the gas contains 4 vol. % oxygen gas ($O_2$) and 96 vol. % argon gas (Ar), wherein a Pt film (lower electrode), a $Cu-SiO_2$ layer (variable resistance layer) and a Cu film (upper electrode) together form a resistance memory.

According to the operation scheme, the resistance memory can be divided into unipolar resistance memory (or termed as "nonpolar resistance memory") and bipolar resistance memory. In following tests on the resistance memories of Experiment 1 and Experiment 2 in different operation schemes are depicted.

Test 1

Figure 3:
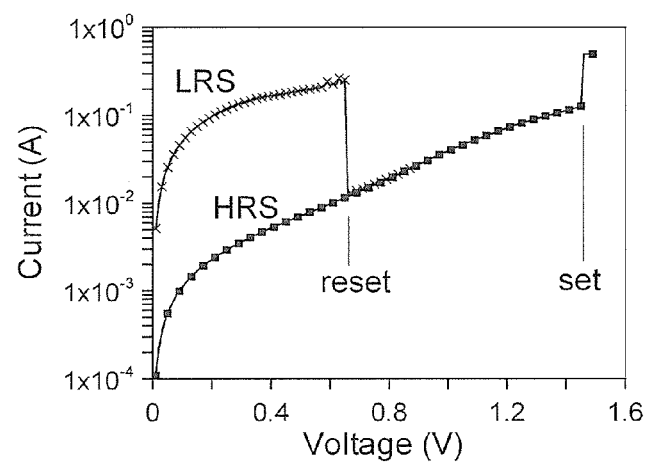
FIG. 3 is an I-V curve chart showing the operation of a resistance memory along a unipolar direction in Experiment 1.

To switch between the high resistive state (HRS) and the low resistive state (LRS) of the resistance memory in Experiment 1, the bias voltages applied on the resistance memory are varied, as shown in FIG. 3. The bias voltage is increased from 0V up, the current going through the $Cu-SiO_2$ layer in the HRS is accordingly increased, as shown by the lower curve in FIG. 3. When the applied voltage reaches a higher voltage value, the current would be instantaneously jumped up, the $Cu-SiO_2$ layer at the time would be instantaneously varied into the LRS and the change is termed as "set". Once again, when the applied voltage is increased from 0V up, the current going through the $Cu-SiO_2$ layer in the newly varied LRS is accordingly increased, as shown by the upper curve in FIG. 3. When the applied voltage reaches a certain value, the current would be instantaneously descended, the $Cu-SiO_2$ layer at the time would be varied into the HRS from the LRS and the change is termed as "reset".

The switching between the HRS and the LRS of a unipolar resistance memory is conducted in the same polarity direction, as shown by FIG. 3 where the operations are conducted under a positive bias. However, the variable resistance layer fabricated according to the present invention can also be operated under a negative bias.

Test 2

Figure 4:
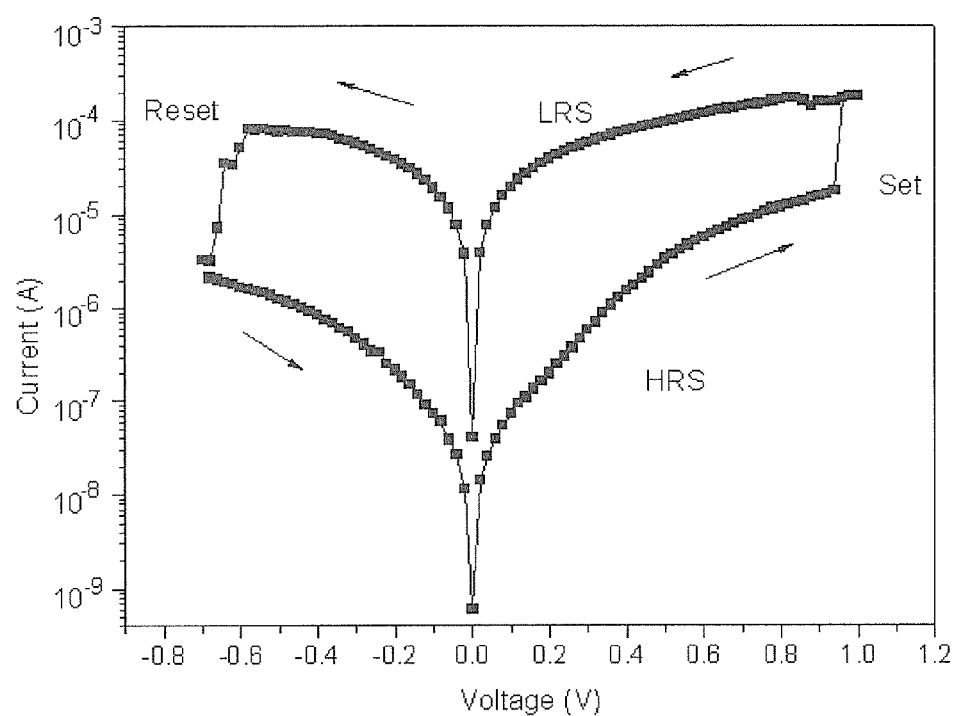
FIG. 4 is an I-V curve chart showing the operation of a resistance memory along two polar directions in Experiment 1.

To switch between the HRS and the LRS of the resistance memory in Experiment 1, the bias voltage applied on the resistance memory is altered, and the operation herein is conducted in two polar directions as shown by FIG. 4, i.e. the operations are repeatedly conducted under a positive bias and under a negative bias.

Referring to the lower-right curve in FIG. 4, first, the voltage is increased from 0V up under a positive bias and the current is gradually increased as well, wherein the $Cu-SiO_2$ layer takes the HRS. When the applied voltage reaches a certain value, the current would be instantaneously jumped up, the Cu—SiO$_2$ layer at the time would be varied into the LRS and the action is termed as "set". To switch the LRS back to the HRS, a reverse operation is conducted as shown by the upper-right curve in FIG. 4, where the positive high voltage is gradually descended into 0V, and the current is also accordingly descended. When the voltage crosses 0V and reaches a negative bias, the absolute value of the negative bias keeps increased, while the negative current is also increased following the upper-left curve in FIG. 4 (at the time, the negative current corresponding to the curve is converted into the absolute value or the positive value thereof) and the Cu—SiO$_2$ layer still keeps the LRS. When the negative bias reaches a certain value, the current is largely reduced and the Cu—SiO$_2$ layer is switched into the HRS and the action is termed as "reset". Furthermore, the negative voltage is gradually descended, and the current is also gradually descended following the lower-left curve in FIG. 4 (the negative current corresponding to the curve is converted into the absolute value or the positive value thereof).

The set and the reset of the operation mode of the resistance memory requires to be conducted under two biases opposite to each other: if a set is done under a positive bias, the reset needs to be done in the reverse direction under a negative bias; if a set is done in beginning under a negative bias, the reset needs to be done in the reverse direction under a positive bias. In this regard, the resistance memory corresponding to the above-mentioned condition is termed as bipolar resistance memory.

Test 3

Figure 5:
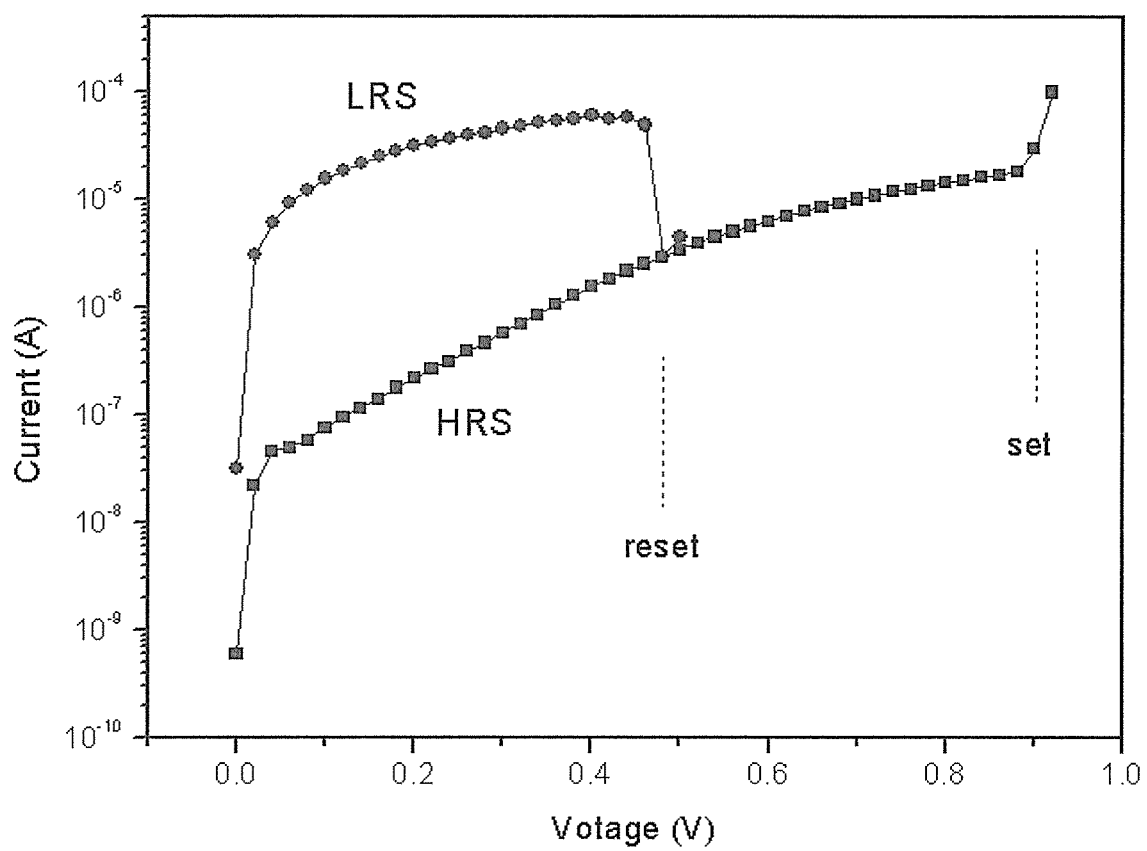
FIG. 5 is an I-V curve chart showing the operation of a resistance memory along a unipolar direction in Experiment 2.

By changing the voltage applied on the resistance memory of Experiment 2 to conduct switching between the HRS and the LRS, FIG. 5 can be obtained. It can be seen from FIG. 5, the resistance memory of Experiment 2 can switch the states thereof under a same polar direction. It should be noted that although the operation is conducted under positive biases, but the resistance memory fabricated by the present invention can also be operated under negative biases.

Test 4

Figure 6:
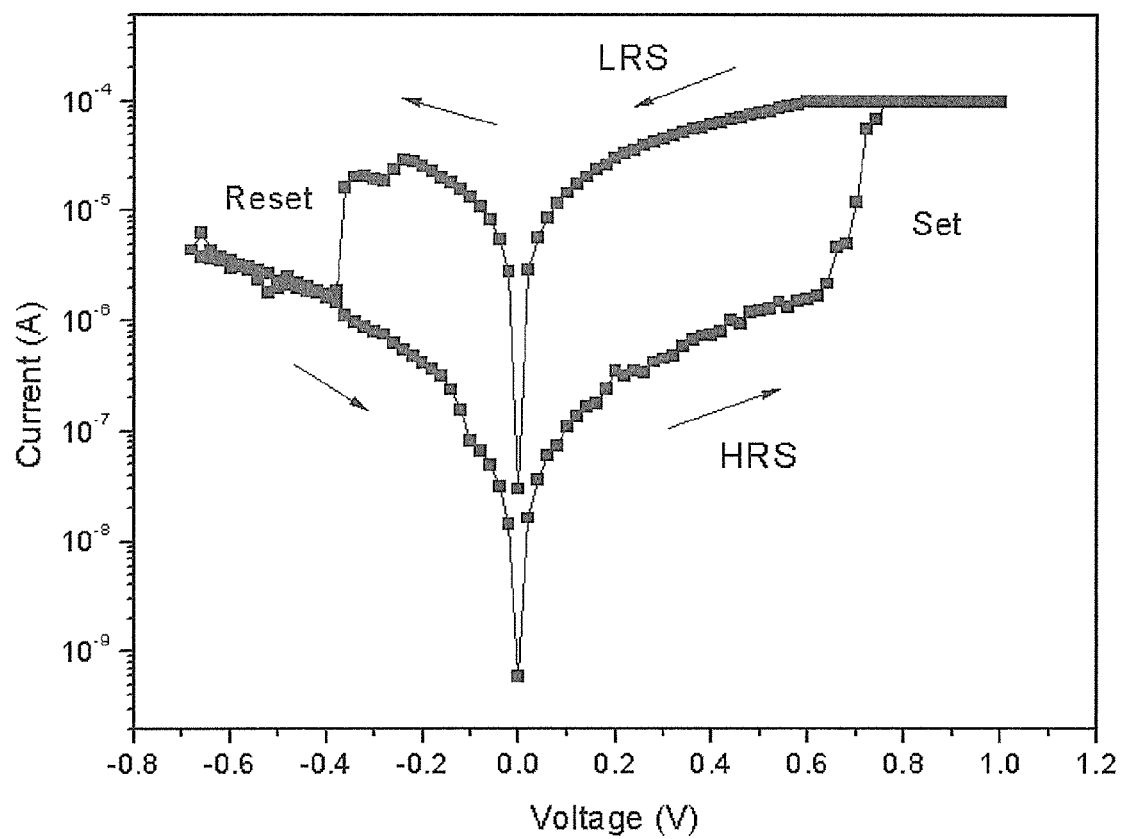
FIG. 6 is an I-V curve chart showing the operation of a resistance memory along two polar directions in Experiment 2.

To conduct the operations back and forth under two polar directions on the resistance memory of Experiment 2, the applied bias voltage is varied and FIG. 6 is obtained. It can be seen from FIG. 6, the resistance memory of Experiment 2 can be used as a bipolar resistance memory.

Base on above tests 1-4, it is certain that the fabricating flow of the above-mentioned embodiment can be used to fabricate the variable resistance layer of a resistance memory.

Figure 7:
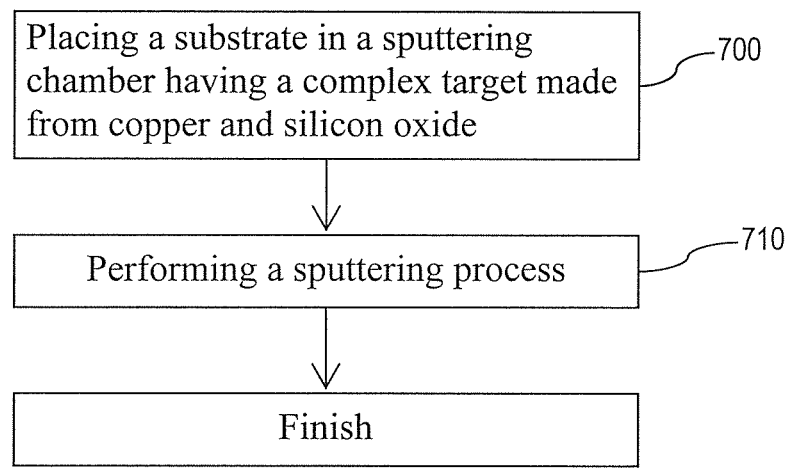
FIG. 7 is a schematic process flowchart of fabricating a variable resistance layer of a resistance memory according to another embodiment of the present invention.

In addition to the embodiment of FIG. 2, the present invention also provides the steps of FIG. 7 to fabricate a variable resistance layer of a resistance memory.

First in step 700, a substrate is placed in a sputtering chamber which has at least a complex target made from Cu and SiO$_2$. The mole percentage of Cu/(Cu+Si) of the complex target is about 1-15%. A substrate support may be in the sputtering chamber to support the substrate, for example.

Next in step 710, a sputtering process by using the above mentioned complex target is performed to deposit a compound film on the surface of the substrate. In the embodiment, the mole percentage of Cu/(Cu+Si) of the deposited complex film is close to the mole percentage of the complex target, so that the deposited film layer serves as the variable resistance layer of a resistance memory. The thickness of the above-mentioned compound film ranges between 10 nm and 100 nm, for example.

In the embodiment, the operation condition is as following: a pressure of the sputtering process is, for example, $5 \times 10^{-3}$ Torr-$5 \times 10^{-2}$ Torr, and a gas is, for example, 100 vol. % argon gas or argon gas containing larger than 0 to 20 vol. % oxygen gas. In addition, during the sputtering process, the substrate may be heated or not. The temperature of the substrate is, for example, between 25° C. and 150° C.

In summary, the method of the present invention can fabricate a variable resistance layer of a resistance memory through performing a single and simple co-sputtering process (or a sputtering process), and during the co-sputtering process (or the sputtering process), there is no need to perform a high-temperature process, which is advantageous than the prior art in terms of the fabrication period and the cost.

It will be apparent to those skilled in the art that the descriptions above are several preferred embodiments of the present invention only, which does not limit the implementing range of the present invention. Various modifications and variations can be made to the structure of the present invention without departing from the scope or spirit of the invention.

What is claimed is:

1. A method of fabricating a resistance memory, comprising:
   placing a substrate in a sputtering chamber having a copper target and a silicon oxide target, wherein a lower electrode is formed on the substrate;
   performing a co-sputtering process by using the copper target and the silicon oxide target, so that a variable resistance layer is deposited on a surface of the lower electrode, wherein the variable resistance layer is a Cu—SiO$_2$ layer and a mole percentage of Cu/(Cu+Si) of the Cu—SiO$_2$ layer is 1-15%; and
   forming a upper electrode on the variable resistance layer.

2. The method of fabricating a resistance memory as claimed in claim 1, wherein powers of a direct current voltage or a radio frequency voltage applied on the copper target and on the silicon oxide target are different from each other.

3. The method of fabricating a resistance memory as claimed in claim 1, wherein a thickness of the variable resistance layer ranges between 10 nm and 100 nm.

4. The method of fabricating a resistance memory as claimed in claim 1, wherein the sputtering chamber further comprises a substrate support for supporting the substrate.

5. The method of fabricating a resistance memory as claimed in claim 4, further comprises rotating the substrate support during performing the co-sputtering process.

6. The method of fabricating a resistance memory as claimed in claim 1, further comprises heating the substrate during performing the co-sputtering process.

7. The method of fabricating-a resistance memory as claimed in claim 1, wherein a temperature of the substrate ranges between 25° C. and 150° C. during performing the co-sputtering process.

8. The method of fabricating a resistance memory as claimed in claim 1, wherein a pressure of the co-sputtering process is between $5 \times 10^{-3}$ Torr and $5 \times 10^{-2}$ Torr.

9. The method of fabricating a resistance memory as claimed in claim 1, wherein a gas of the co-sputtering process comprises 100 vol. % argon gas or argon gas containing larger than 0 and not larger than 20 vol. % oxygen gas.

10. A method of fabricating a resistance memory, comprising:
    placing a substrate in a sputtering chamber having at least a complex target made from copper (Cu) and silicon oxide (SiO$_2$), wherein a mole percentage of Cu/(Cu+Si) of the complex target is 1-15%, wherein a lower electrode is formed on the substrate; and
    performing a sputtering process by using the complex target, so that a variable resistance layer is deposited on a surface of the lower electrode, wherein the variable resistance layer is a Cu—SiO$_2$ layer; and forming a upper electrode on the variable resistance layer.

11. The method of fabricating a resistance memory as claimed in claim 10, wherein a thickness of the variable resistance layer ranges between 10 nm and 100 nm.

12. The method of fabricating a resistance memory as claimed in claim 10, wherein the sputtering chamber further comprises a substrate support for supporting the substrate.

13. The method of fabricating a resistance memory as claimed in claim 10, further comprises heating the substrate during performing the sputtering process.

14. The method of fabricating a resistance memory as claimed in claim 10, wherein a temperature of the substrate ranges between 25° C. and 150° C. during performing the sputtering process.

15. The method of fabricating a resistance memory as claimed in claim 10, wherein a pressure of the sputtering process is between $5 \times 10^{-3}$ Torr and $5 \times 10^{-2}$ Torr.

16. The method of fabricating a resistance memory as claimed in claim 10, wherein a gas of the sputtering process comprises 100 vol. % argon gas or argon gas containing larger than 0 and not larger than 20 vol. % oxygen gas.

* * * * *